(12) United States Patent
Nishiura

(10) Patent No.: US 7,990,716 B2
(45) Date of Patent: Aug. 2, 2011

(54) HEAT SINK STRUCTURE AND TEST HEAD WITH SAME

(75) Inventor: Koei Nishiura, Tokyo (JP)

(73) Assignee: Advantest Corporation, Tokyo (JP)

( * ) Notice: Subject to any disclaimer, the term of this patent is extended or adjusted under 35 U.S.C. 154(b) by 93 days.

(21) Appl. No.: 12/333,392

(22) Filed: Dec. 12, 2008

(65) Prior Publication Data

US 2010/0148792 A1  Jun. 17, 2010

(51) Int. Cl.
H05K 7/20 (2006.01)
G01R 31/02 (2006.01)

(52) U.S. Cl. ........ 361/710; 361/718; 361/719; 361/720; 361/679.54

(58) Field of Classification Search .................. 361/710, 361/718, 719, 679.54, 720
See application file for complete search history.

(56) References Cited

U.S. PATENT DOCUMENTS

| | | | |
|---|---|---|---|
| 6,377,453 B1 * | 4/2002 | Belady | 361/679.47 |
| 6,421,240 B1 * | 7/2002 | Patel | 361/699 |
| 6,687,126 B2 * | 2/2004 | Patel et al. | 361/702 |
| 6,972,581 B2 | 12/2005 | Yamashita et al. | |
| 7,364,684 B2 * | 4/2008 | Brandenburg et al. | 264/272.13 |
| 7,616,444 B2 * | 11/2009 | Munch et al. | 361/719 |
| 2002/0159233 A1 * | 10/2002 | Patel et al. | 361/702 |
| 2004/0250992 A1 * | 12/2004 | Aoki et al. | 165/80.3 |
| 2006/0144566 A1 * | 7/2006 | Jensen et al. | 165/104.28 |
| 2007/0114656 A1 * | 5/2007 | Brandenburg et al. | 257/714 |
| 2008/0175008 A1 * | 7/2008 | Hu et al. | 362/373 |
| 2009/0027073 A1 | 1/2009 | Nishiura | |

FOREIGN PATENT DOCUMENTS

| | | | |
|---|---|---|---|
| JP | 03274796 A | * | 12/1991 |
| JP | 10-256444 A | | 9/1998 |
| JP | 11-251496 A | | 9/1999 |
| JP | 2001-281295 | | 10/2001 |
| JP | 2003-289192 | | 10/2003 |
| JP | 2008-199058 | | 8/2008 |
| JP | 2008-273476 | | 11/2008 |
| KR | 0706216 | | 4/2007 |

OTHER PUBLICATIONS

English language Abstract and translation of JP 11-251496 A (Sep. 17, 1999).
English language Abstract and translation of JP 10-256444 A (Sep. 25, 1998).

* cited by examiner

Primary Examiner — Anatoly Vortman
(74) Attorney, Agent, or Firm — Greenblum & Bernstein, P.L.C.

(57) ABSTRACT

A heat sink structure having an improved heat radiation efficiency is disclosed. The heat sink structure comprises a plate-shaped heat sink having a top surface and a bottom surface, wherein through holes along a planar direction of a board are formed between the top surface and the bottom surface of the heat sink.

6 Claims, 20 Drawing Sheets

HEAT SINK STRUCTURE AND TEST HEAD WITH SAME

TECHNICAL FIELD

The present invention relates to a heat sink structure for cooling an electronic device mounted on a board, and a test head with the same.

BACKGROUND ART

In the process of production of semiconductor integrated circuits and other electronic devices (hereinafter also called simply DUTs (Devices Under Test)), an electronic device test apparatus is used to test the performance and functions of the DUTs.

This electronic device test system comprises: a test head having sockets electrically contacting the DUTs; a tester testing the DUTs via the test head; and a handler successively transporting DUTs on the test head and classifying the finished tested DUTs in accordance with the test results.

The test head comprises a plurality of pin electronics cards used as electrical interfaces between the DUTs and the tester. Each of pin electronics cards comprises a board on which high frequency circuits for test, power circuits, and various other types of testing devices are mounted.

Among the testing devices mounted on the pin electronics cards, there are ones which generate a lot of heat, and are heated to a high temperature. As the heat sinks for cooling these testing devices, ones having a large number of fins projecting upward have been known (for example, see Patent Documents 1 and 2).

[Patent Document 1] Japanese Patent Publication (A) No. H11-251496
[Patent Document 2] Japanese Patent Publication (A) No. H10-256444

DISCLOSURE OF INVENTION

To improve the heat radiation efficiency of the above heat sink and reduce the heat of the testing devices, it is necessary to extend the fins of the heat sink. On the other hand, a large number of pin electronics cards align inside the test head. For this reason, the thickness of each card is limited and the extension of the fins is limited, so there was the problem that there were limits to the improvement of the heat radiation efficiency of the heat sinks.

The problem to be solved by the present invention is to provide a heat sink structure able to improve the heat radiation efficiency without thickening of the heat sink, and a test head with the same.

According to the present invention, there is provided a heat sink structure for cooling an electronic device mounted on a board, the heat sink structure comprising a plate-shaped heat sink having a top surface and a bottom surface, wherein a through hole penetrating along a planar direction of the board is formed between the top surface and the bottom surface of the heat sink.

Further, according to the present invention, there is provided a heat sink structure for cooling an electronic device mounted on a board, the heat sink structure comprising a heat sink having a plurality of plates stacked on each other, wherein a through hole penetrating along a planar direction of the board is provided between the plurality of plates.

In the above invention, preferably a thickness (t) of the heat sink and a length (W) of the heat sink along a direction substantially perpendicular to an axial of the through hole satisfy the following relationship formula:

$$8 \leq W/t \leq 40$$

In the above invention, preferably the structure further comprises: a fastening member fastening the heat sink to the board at a first point; and an elastic member pressing the heat sink at a second point, wherein the electronic device is arranged so that a center of the electronic device is positioned on an imaginary line connecting the first points and the second point in a plan view.

In the above invention, preferably the structure further comprises: two fastening members respectively fastening the heat sink to the board at first points; and an elastic member pressing the heat sink at a second point positioned between the first points in a plan view, wherein the electronic device is arranged between the first point and the second point in a plan view.

In the above invention, preferably the structure further comprises a fastening member fastening the heat sink to the board, wherein the fastening member has a guide pin projecting out toward the heat sink, and the heat sink has a guide hole or notch able to mate with the guide pin.

In the above invention, preferably the structure further comprises a cover member covering an electronic device without the heat sink in the board, wherein a distance between the cover member and the electronic device is substantially the same as an inside diameter of the through hole along a thickness direction of the heat sink.

In the above invention, preferably the heat sink contacts the electronic device via a heat conductive sheet.

Further, according to the present invention, there are provided test heads comprising a plurality of boards having the above heat sink structures.

In the present invention, by providing a through hole running along a planar direction of a board in a heat sink, it is possible to increase the surface area of the heat sink and improve the heat radiation efficiency even without thickening of the heat sink.

BEST MODE FOR CARRYING OUT THE INVENTION

Below, embodiments of the present invention will be explained based on the drawings.

FIG. 1 is a schematic cross-sectional view showing an electronic device test apparatus in the present embodiment, while FIG. 2 and FIG. 3 are respectively schematic cross-sectional views of a test head along the line II-II and the line III-III of FIG. 1.

An electronic device test apparatus in an embodiment of the present invention, as shown in FIG. 1, comprises a test head 10 electrically connected to DUTs; a tester 5 for sending out test signals via the test head 10 to the DUTs and examining response signals; and a handler 1 successively conveying DUTs on to the test head 10 and classifying the DUTs finished being tested in accordance with the test results. This electronic device test apparatus tests whether the DUTs are suitably operating in state that the DUTs are applied high temperature or low temperature thermal stress (or in ordinary temperature state), and classifies the DUTs in accordance with the test results.

As shown in FIG. 1, sockets 12 are provided at the top of the test head 10 and are electrically connected to the DUTs at the time of testing. These sockets 12, as shown in the figure, approach inside the handler 1 via the opening 1a formed in the handler 1. The conveyed DUTs are pushed against the sockets 12 by the handler 1. Note that a heat plate type or a chamber type may be used as the handler 1.

The sockets 12 have large numbers of contact pins (not shown) electrically contacting the terminals of the DUTs. As shown in FIG. 2 and FIG. 3, they are mounted on a socket board 11. The socket board 11 is electrically connected via cables 13 to a performance board 14. In the present embodiment, for example, 10 sockets 12 are arranged in two rows and five columns on the socket board 11.

A plurality of (in this example, 10) pin electronics cards 20 are housed inside the test head 10. Connectors 23 are provided at the top ends of the pin electronics cards 20. These connectors 23 are designed to be able to mate with connectors (not shown) of the performance board 14 side. By mating of these connectors, the performance board 14 and the pin electronics cards 20 are electrically connected.

Similarly, connectors 24 are provided at the bottom ends of the pin electronics cards 20. These connectors 24 are designed to be able to mate with connectors (not shown) of the back board 15 provided at the bottom of the test head 10. By mating of these connectors, the pin electronics cards 20 and the back board 15 are electrically connected. The back board 15 is connected via cables 6 to the tester 5.

Further, the test head 10 in the present embodiment comprises fans 16 for cooling air-cooled type heat sinks 30 to 60 mounted on the pin electronics cards 20. When the fans 16 are driven, the air in the test head 10 is exhausted to the outside and fresh air is supplied to the heat sinks 30 to 60 from the outside.

Note that in the present embodiment, as shown in FIG. 2 and FIG. 3, 10 pin electronics cards 20 are arranged inside the test head 10 in a straight standing state, however the invention is not particularly limited to this. It is possible to freely set the number of pin electronics cards housed inside the test head 10. Further, the pin electronics cards 20 may also be arranged horizontally inside the test head 10. Note that, to enable easy understanding of the internal configuration of the test head 10, the pin electronics cards 20 are shown distant from each other in FIG. 3, however practically the cards 20 are close to each other.

FIG. 4 to FIG. 7 are a plan view, a side view, a front view, and a back view of a pin electronics card in the present embodiment, FIG. 8A and FIG. 8B are disassembled perspective views of a pin electronics card, FIG. 9A to FIG. 9C are cross-sectional views of FIG. 8A, FIG. 10 to FIG. 12 are plan views showing first to third heat sinks in the present embodiment, FIG. 13 is a cross-sectional view of second and third heat sinks, FIG. 14 is a cross-sectional view of second and third heat sinks in another embodiment, FIG. 15 and FIG. 16 are disassembled perspective views of parts of a pin electronics card in the present embodiment, and FIG. 17 is a disassembled perspective view showing the mating relationship of the second and third heat sinks and a first pressing member.

Each pin electronics card 20, as shown in FIG. 4 to FIG. 7, comprises: a plurality of testing devices 22a to 22e used for testing DUTs; and a board 21 on which the testing devices 22a to 22e are mounted at the both surfaces. For example, a printed circuit board made of a glass epoxy resin etc., a glass board, a ceramic board, etc. may be cited as specific examples of the board 21. Further, for example, high frequency circuits in which LSIs etc. are built so as to handle the test signals, or power circuits in which switching regulators are built so as to supply test power to the DUTs, etc. may be cited as specific examples of the testing devices 22a to 22e.

Note that the first to fifth testing devices 22a to 22e, which generate heat and require heat sinks, are only shown in FIG. 4. Practically, in addition to the first to fifth testing devices 22a to 22e, testing devices not requiring heat sinks (for example, the testing devices 22f shown in FIG. 18) are also mounted on the board 11. Note that FIG. 8A does not show any testing devices.

Further, the pin electronics card 20 in the present embodiment, as shown in FIG. 4, comprises: four types of heat sinks 30 to 60 for cooling the first to fifth testing devices 22a to 22e; and an adjustment plate 70 for adjusting the flow rate of air conducted to the heat sinks 30 to 60.

The first heat sinks 30, as shown in FIG. 4 and FIG. 9A, are meant for cooling the first testing devices 22a. Four second heat sinks 40 are provided at one surface of the board 21 and are meant for cooling the second testing devices 22b. Four third heat sinks 50 are also provided at one surface of the board 11 and are meant for cooling the third and fourth testing devices 22c, 22d. The fourth heat sinks 60 are meant for cooling the fifth testing devices 22e. As shown in FIG. 5 and FIG. 6, the heat sinks 30 to 60 and the adjustment plate 70 are also provided at the opposite surface of the board 21. The bottom view of the pin electronics card 20 is shown symmetric with FIG. 4.

Furthermore, this pin electronics card 20, as shown in FIG. 4, comprises: a rod-shaped member 80 for pushing the first heat sink 30 toward the board 21 side; first and second stays 90, 100 for fixing the second and third heat sinks 40, 50 to the board 21; and first and second pressing members 110, 120 pushing the second and third heat sinks 40, 50 by coil springs 115, 122. Note that the first pressing members 110 also function to fasten the third heat sinks 50 to the board 21.

Below, the respective members forming the pin electronics cards 20 will be explained in detail and the methods of assembling them will also be explained.

A first heat sink 30, as shown in FIG. 10, comprises a thin plate. Head conductive sheets 31 are adhered at positions facing two first testing devices 22a mounted on the board 21. Aluminum, copper, an alloy including the same, or other metal material superior in heat conductivity and workability may be cited as the material of which the first heat sink 30 is made. Further, for example, phase change sheets made of silicone rubber, acryl rubber, etc. changing from a solid to liquid at a predetermined temperature may be cited as specific examples of the heat conductive sheets 31.

As shown in FIG. 9B and FIG. 10, first mounting pieces 32 project out from the both ends of each first heat sink 30. Further, as shown in FIG. 8A, connection members 34, 35 are attached to the first mounting piece 32. The first heat sink 30 is fixed to the board 21 via the connection members 34, 35.

Further, as shown in FIG. 10, second mounting pieces 33 project out from one side of the first heat sink 30 (in the figure, bottom side). As shown in FIG. 8A, the second mounting pieces 33 are attached to a first stay 90.

As shown in FIG. 8A and FIG. 9C, a front end 81 of a bent rod-shaped member 80 is fastened to the approximate center of this first stay 90. On the other hand, a rear end 83 of this rod-shaped member 80, as shown in FIG. 9C, is designed to be able to engage with the first pressing member 110. Further, a projecting part 82 projecting out toward the board 21 side is formed at the bent part of the rod-shaped member 80.

When the first pressing member 110 is attached to the board 11 in the state where the rear end 83 of the rod-shaped member 80 engages with the first pressing member 110, the projecting part 82 of the rod-shaped member 80 presses the approximate center of the first heat sink 30. At this time, due to the elastic force of the rod-shaped member 80, it is possible to absorb variations of the first testing device 22a in the height direction. Further, by the projecting part 82 of the rod-shaped member 80 pressing the first heat sink 30 between the two first testing devices 22a, it is possible to equalize the loads applied to the two first testing devices 22a.

As shown in FIG. 8B, a second heat sink 40 is arranged on the first heat sink 30 via a first stay 90. This second heat sink 40, as shown in FIG. 11 and FIG. 13, comprises a single plate-shaped member having a top surface 41 and a bottom surface 42. Three through holes 43 to 45 are formed between the top surface 41 and bottom surface 42 of this second heat sink 40. The three through holes 43 to 45 are all formed along the planar direction of the board 21 (X-direction in the figure). Due to the existence of the through holes 43 to 45, it is possible to enlarge the surface area and improve the heat radiation efficiency without thickening of the second heat sink 40.

Note that the number of through holes formed in the second heat sink 40 is not particularly limited. Further, in the present embodiment, as shown in FIG. 13, three through holes 43 to 45 were aligned in the Y-direction, however the present invention is not particularly limited to this. For example, it is also possible to arrange the plurality of through holes along the Z-direction.

Each second heat sink 40, similarly to the first heat sink 30, for example, is made of aluminum, copper, their alloys, or other metal materials superior in heat conductivity and workability. As the method of production of the second heat sink 40, for example, extrusion molding, milling, etc. may be used.

Note that as shown in FIG. 14, the second heat sink 40' may comprises two plates 40a, 40b. Relief shapes are formed on one plate 40a by press forming. When overlapping the plates 40a, 40b, two through holes 43', 44' extending along the X-direction in the figure are formed between the plates 40a, 40b. The two plates 40a, 40b are for example joined by spot welding. Note that the number of plates forming the heat sink is not particularly limited. By increasing the number of plates, it is possible to improve the heat radiation efficiency.

Returning to FIG. 13, the thickness (notation $t_1$ shown in FIG. 13) of this second heat sink 40 is preferably 10 to 15 mm. Further, the length of the second heat sink 40 along the X-direction (notation $W_1$ shown in FIG. 11 and FIG. 13) is preferably 120 to 400 mm. That is, the aspect ratio ($W_1/t_1$) in the cross-section of the second heat sink 40 is preferably in the range of 8 to 40 ($8 \leq W_1/t_1 \leq 40$). Note that the thickness $t_1$ of the second heat sink 40 is the thickness of the part of the second heat sink 40 where the through holes 43 to 45 are formed. In the present embodiment, it is the thickness between the top surface 41 and the bottom surface 42 except the projecting part 42a for engaging with the first pressing member 110.

On the bottom surface 42 of this second heat sink 40, as shown in FIG. 15, a heat conductive sheet 46 is adhered at a position facing the second testing device 22b mounted on the board 21. For example, a phase change sheet similar to the above heat conductive sheet 31 may be cited as a specific example of this heat conductive sheet 46. Note that FIG. 15 does not show the first heat sink 30 positioned below the second heat sink 40.

As shown in FIG. 11, a fastening hole 47 for fastening the second heat sink 40 to a first stay 90 is formed at one end of the second heat sink 40 (bottom end in the figure). As shown in FIG. 8B, FIG. 13, and FIG. 15, the second heat sink 40 is fastened to the first stay 90 by screws 92 in the state with a wave washer 91 interposed. By fastening the second heat sink 40 to the board 21 via the first stay 90, it is possible to fasten the second heat sink 40 at any position on the board 21 and the design freedom of the pin electronics card 20 is improved.

On the other hand, as shown in FIG. 11, a recess 48 is formed at the other end of the second heat sink 40. The recess 48, as shown in FIG. 15 and FIG. 17, is formed so as to face the recess 111 formed at the bottom surface of the first pressing member 110. The first pressing member 110, as shown in FIG. 15, is fastened to the board 21 by screws 116 in the state with the coil spring 115 interposed in the recesses 46, 111. In this state, the second heat sink 40 is pushed by the coil spring 115 toward the board 21. Due to this, the variations of the second testing device 22b in the height direction can be absorbed.

As shown in FIG. 11, the second testing device 22b is arranged so that a center of that device 22b is positioned on a first imaginary line $L_1$ connecting the center of the fastening hole 47 and the center of the recess 48 in a planar view. Due to this, it is possible to uniformize the surface pressure in the second testing device 22b.

Further, as shown in FIG. 11, a guide hole 49 adjoining the recess 48 is formed at the other end of the second heat sink 40. This guide hole 49, as shown in FIG. 17, is formed so as to face a first guide pin 112 projecting out from the bottom surface of the first pressing member 110. The first guide pin 112 can be fit into the guide hole 49. Due to this, it is possible to facilitate the assembly work of the pin electronics card 20.

The third heat sink 50, similarly to the second heat sink 40, as shown in FIG. 12 and FIG. 13, comprises a single plate-shaped member having a top surface 51 and a bottom surface 52. Two through holes 53, 54 are formed between the top surface 51 and the bottom surface 52 of this third heat sink 50. The two through holes 53, 54 are both formed along the planar direction of the board 21 (X-direction in the figure). Due to the presence of these through holes 53, 54, the surface area can be enlarged and the heat radiation efficiency can be improved without thickening of the third heat sink 50. A material and a method of production of this third heat sink 50 are similar to those of the above second heat sink 40.

Note that the number of the through holes formed in each third heat sink 50 is not particularly limited. Further, in the present embodiment, as shown in FIG. 13, two through holes 53, 54 were arranged along the Y-direction, however the invention is not particularly limited to this. For example, it is also possible to arrange a plurality of through holes along the Z-direction.

Further, as shown in FIG. 14, each third heat sink 50' may also comprise two plates 50a, 50b. Relief shapes are formed on one plate 50a by press forming. When overlapping the plates 50a, 50b, two through holes 53', 54' extending along the X-direction in the figure are formed between the plates 50a, 50b. The two plates 50a, 50b are for example joined by spot welding. Note that the number of the plates forming the heat sink is not particularly limited. By increasing the number of the plates, it is possible to improve the heat radiation efficiency.

Returning to FIG. 13, the thickness (notation $t_2$ shown in FIG. 13) of the third heat sink 50 is preferably 10 to 15 mm. Further, the length of the third heat sink 50 along the X-direction (notation $W_2$ in FIG. 12 and FIG. 13) is preferably 120 to 400 mm. That is, the aspect ratio ($W_2/t_2$) in the cross-section of the third heat sink 50 is preferably in the range of 8 to 40 ($8 \leq W_2/t_2 \leq 40$). Note that the thickness $t_2$ of the third heat sink 50 is the thickness of the part of the third heat sink 50 where the through holes 53, 54 are formed. In the present embodiment, it is the thickness between the top surface 51 and the bottom surface 52 except the projecting part 52a for contacting the third and fourth testing device 22c, 22d.

Since the third heat sink 50 is meant for cooling a plurality of testing devices 22c, 22d. As shown in FIG. 8B, two heat conductive sheets 55 are adhered to the bottom surface 52 so as to face the third and fourth testing devices 22c, 22d mounted on the board 21. As specific examples of the heat conductive sheet 55, for example, phase change sheets similar to the above-mentioned heat conductive sheets 31, 46 may be cited.

As shown in FIG. 12, an engagement piece 56 projects out from one end of the third heat sink 50 (bottom end in the figure). The center part of this engagement piece 56 is cut out in a semicircle whereby a notch 56a is formed. As shown in FIG. 8B, FIG. 13, and FIG. 17, by inserting the engagement piece 56 into the groove 114 in the state that the second guide pin 113 projecting out from the bottom surface of the first pressing member 110 is aligned with the notch 56a, the third heat sink 50 is attached to the first pressing member 110. By the second guide pin 133 and the notch 56, the assembly work of the pin electronics card 20 can be facilitated. Further, by the second guide pin 113 being inserted into the notch 56a, horizontal shift of the third heat sink 50 due to impact in the horizontal direction is prevented.

On the other hand, as shown in FIG. 12, a fastening hole 57 for attaching the third heat sink 50 to the second stay 100 is formed at the other end of the third heat sink 50. As shown in FIG. 8B, FIG. 13 and FIG. 16, the third heat sink 50 is fastened to the second stay 100 by screws 102 in the state with a wave washer 101 interposed. The second stay 100 is screwed to the board 21. By fastening the third heat sink 50 to the board 21 via the second stay 100 in this way, it is possible to fasten the third heat sink 50 at any position on the board 21 and increase the design freedom of pin electronics cards 20.

As shown in FIG. 12, a groove 58 crossing in the x-direction is formed at the approximate center of the third heat sink 50. Further, a recess 58a is formed at the approximate center of this groove 58. A second pressing member 120 can be inserted into the groove 58. The recess 58a, as shown in FIG. 16, is formed so as to face the recess 121 formed in the bottom surface of the second pressing member 120. The second pressing member 120, as shown in the figure, is fastened to the board 21 by screws 123 in the state with the coil spring 122 interposed in the recesses 58a, 121. In this state, the third heat sink 50 is pressed by the coil spring 122 toward the board 21. Due to this, the variations of the third and fourth testing devices 22c, 22d in the height direction can be absorbed.

As shown in FIG. 12, in the plan view, the third testing device 22c is arranged between the notch 56a and the recess 58a, while the fourth testing device 22d is arranged between the fastening hole 57 and the recess 58a. By the coil spring 122 pushing between a plurality of testing devices 22c, 22d in this way, the plurality of testing devices 22c, 22d can be evenly pressed.

FIG. 18 is a cross-sectional view of an adjustment plate in the present embodiment, FIG. 19 is a plan view showing a fourth heat sink in the present embodiment, and FIG. 20 is a cross-sectional view of the adjustment plate and the fourth heat sink in the present embodiment.

The adjustment plate 70, as shown in FIG. 4, is fastened to the board 21 so as to cover the space from the second heat sink 40 to the bottom end of the board 21. As shown in FIG. 18, testing devices 22f not requiring heat sinks are mounted in this space. A distance $S_1$ between the testing devices 22f and the adjustment plate 70 is substantially the same as the inner diameter $S_2$ along the Z-direction of the through hole 43 of the second heat sink 40 ($S_1=S_2$). Due to this, it is possible to keep down the flow rate of the air flowing around the testing device 22g and increase the flow rate of air flowing through the second and third heat sinks 40, 50.

Further, as shown in FIG. 4, testing devices 22f and also a fifth testing device 22e are mounted in the space of the board 21 covered by the adjustment plate 70. A fourth heat sink 60 is attached to the back surface of the adjustment plate 70 so as to face the fifth testing device 22e.

This fourth heat sink 60, as shown in FIG. 19, comprises a single plate-shaped member formed in a recessed shape. A heat conductive sheet 61 is adhered at a position facing the fifth testing device 22e mounted on the board 21. As the material of which the fourth heat sink 60 is made, in the same way as the first heat sink 30, aluminum, copper, an alloy containing these, or other metal material superior in heat conductivity and workability may be used. Further, as a specific example of a heat conductive sheet 61, a phase change sheet similar to the above heat conductive sheets 31, 46, 55 may be used.

This fourth heat sink 60, as shown in FIG. 19 and FIG. 20, is screwed to the adjustment plate 70 through two upper and lower fastening holes 61, 62. A coil spring 64 is interposed between the fourth heat sink 60 and the adjustment plate 70. Due to the elastic force of this coil spring 64, it is possible to absorb the variation of the fifth testing device 22e in the height direction.

As explained above, in the present embodiment, by providing the second and third heat sinks 30, 40 with the through holes 43 to 45, 53, 54 along the planar direction of the board 21, it is possible to increase the surface area of the heat sinks 30, 40 and improve the heat radiation efficiency even without thickening of the heat sinks 30, 40.

Note that the embodiments explained above were described to facilitate understanding of the present invention and were not described to limit the present invention. Therefore, the elements disclosed in the above embodiments include all design changes and equivalents falling under the technical scope of the present invention.

DESCRIPTION OF NOTATIONS

Figure 1:
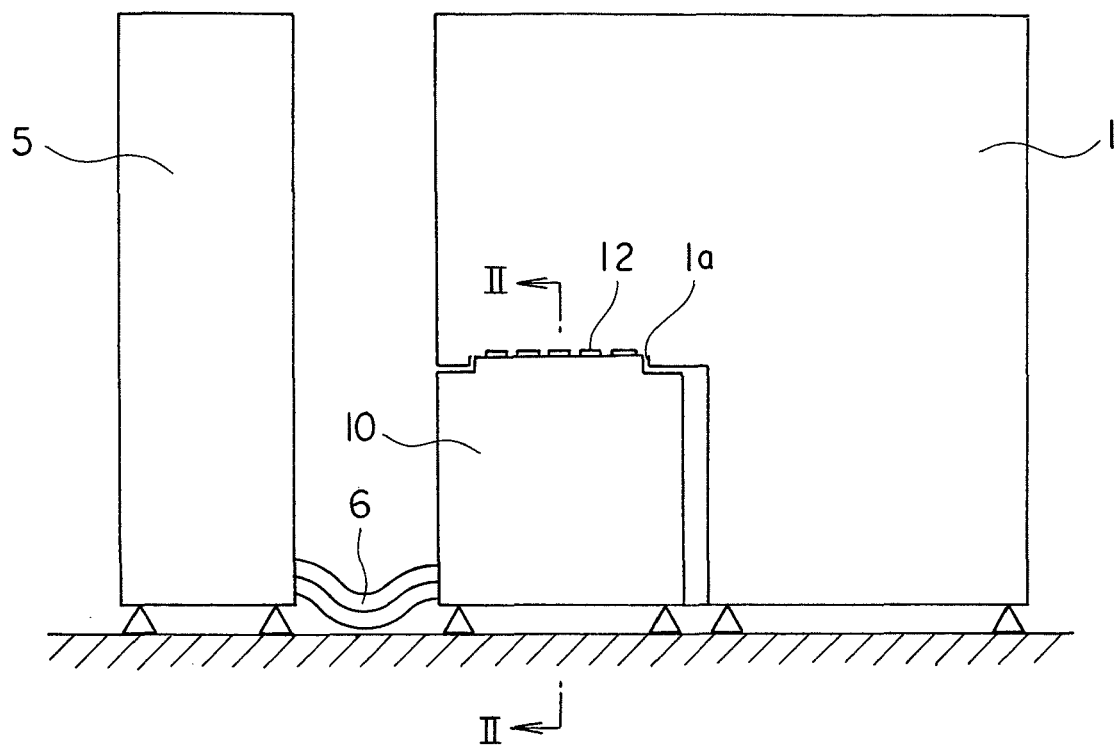
FIG. 1 is a schematic cross-sectional view showing an electronic device test apparatus in an embodiment of the present invention.
Figure 2:
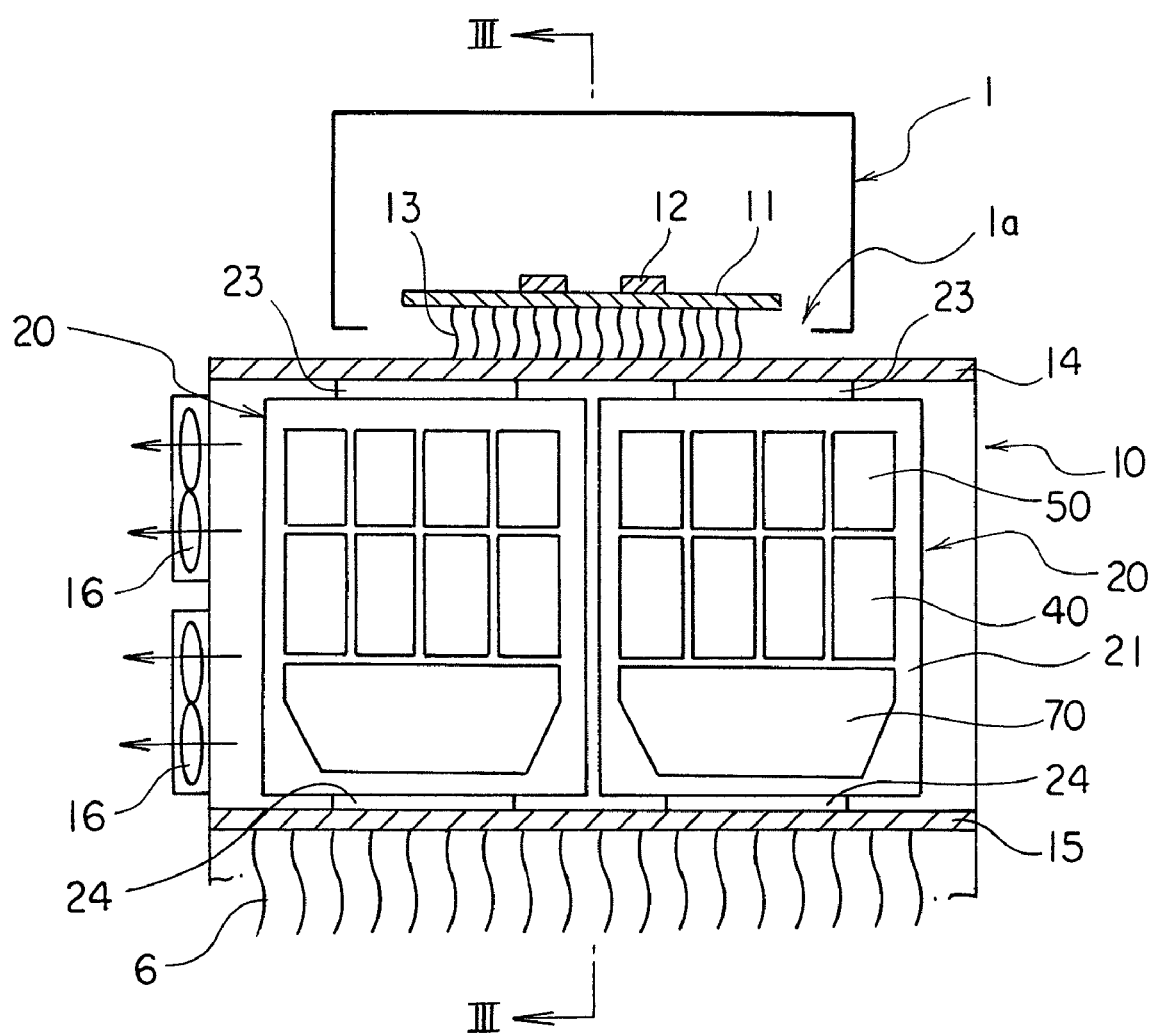
FIG. 2 is a schematic cross-sectional view of a test head along a line II-II of FIG. 1.
Figure 3:
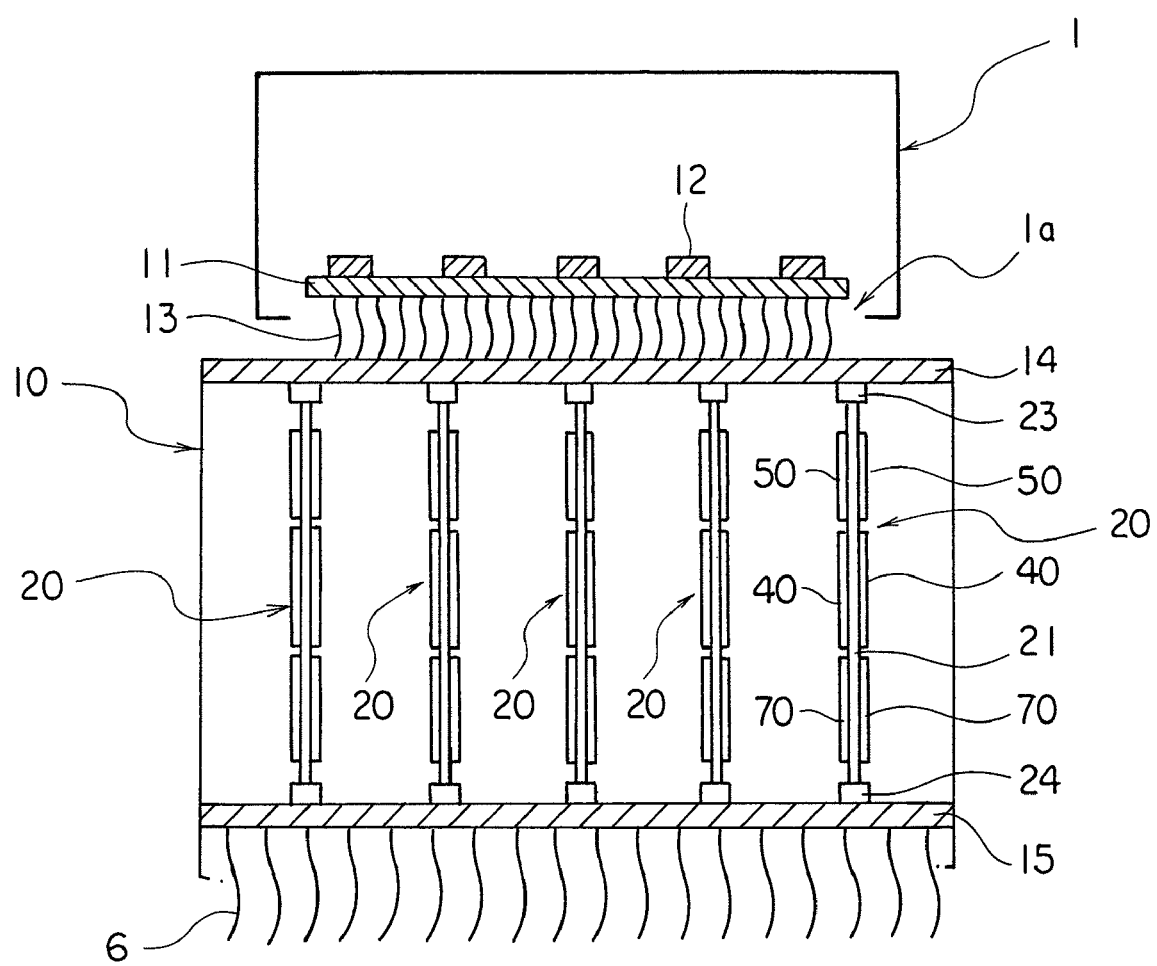
FIG. 3 is a schematic cross-sectional view of a test head along a line III-III of FIG. 2.
Figure 4:
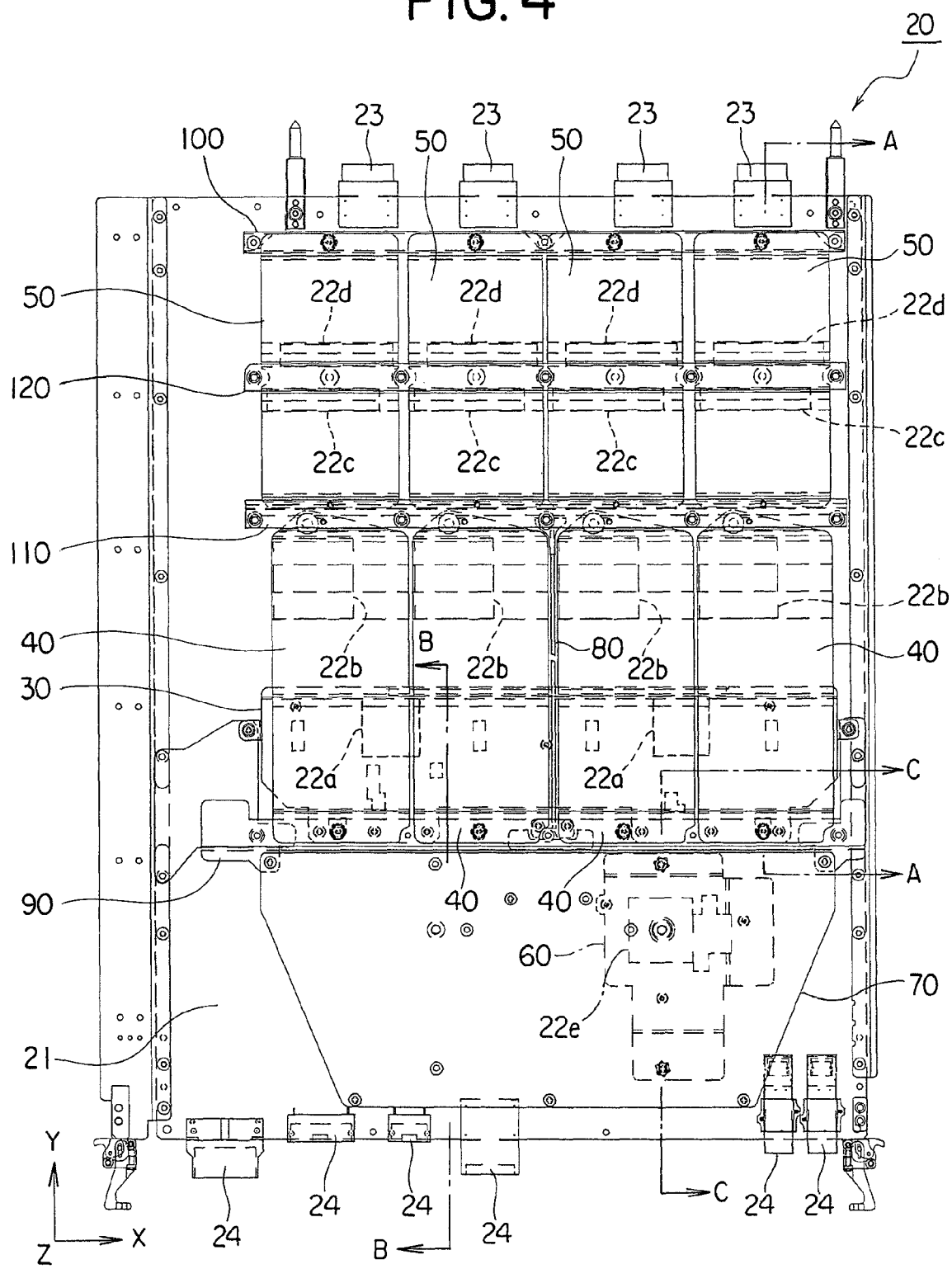
FIG. 4 is a plan view of a pin electronics card in an embodiment of the present invention.
Figure 5:
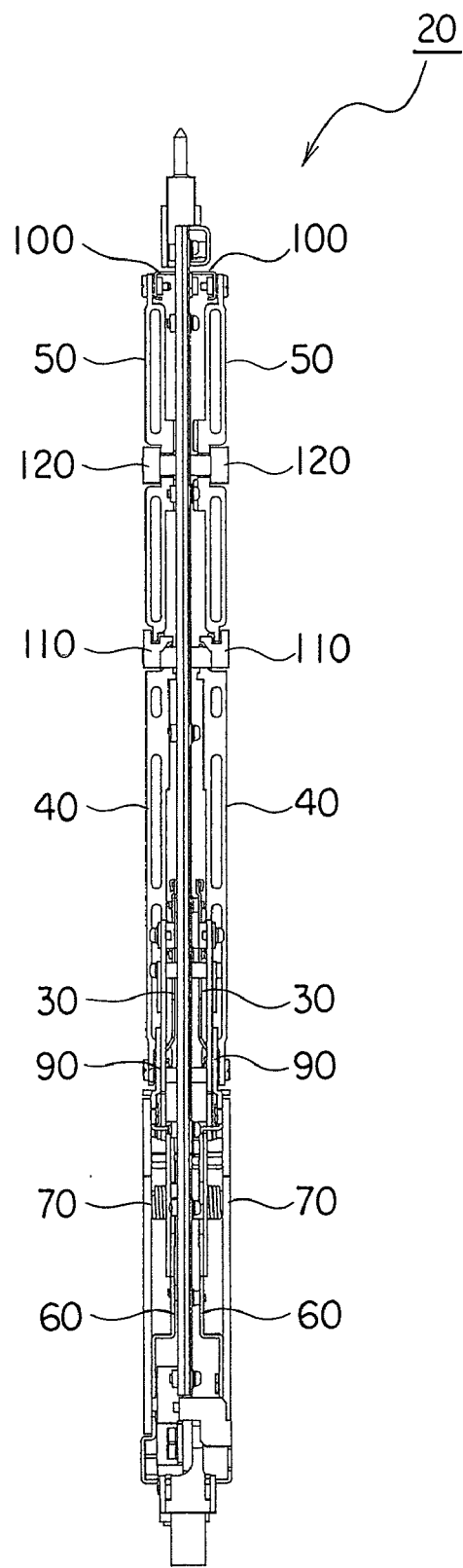
FIG. 5 is a side view of a pin electronics card in an embodiment of the present invention.
Figure 6:
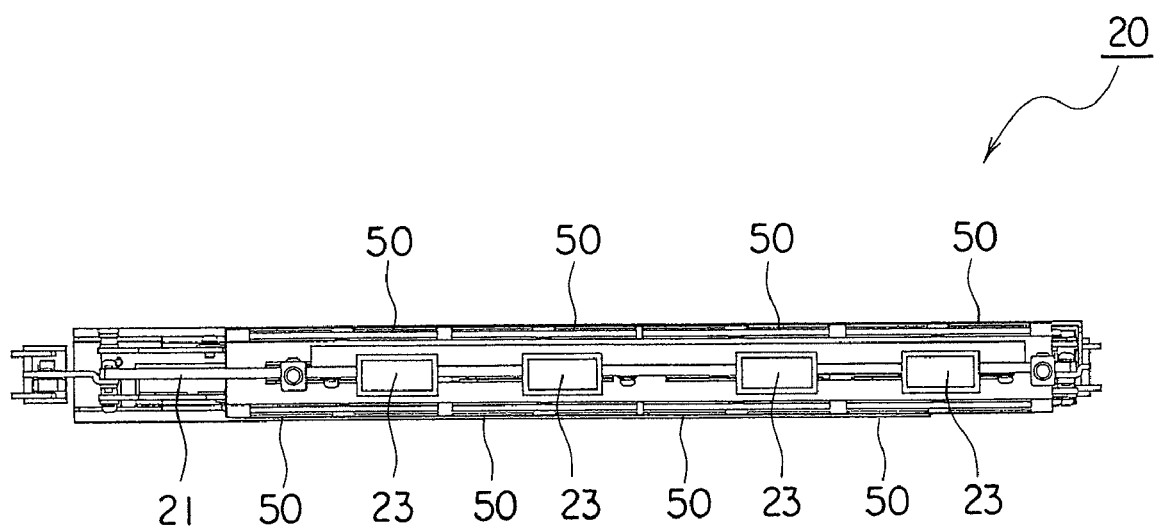
FIG. 6 is a front view of a pin electronics card in an embodiment of the present invention.
Figure 7:
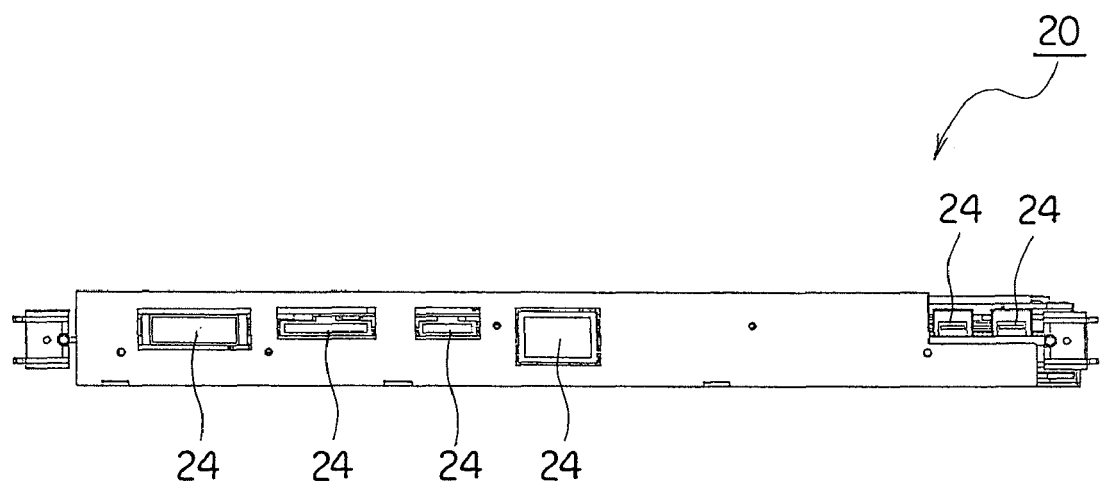
FIG. 7 is a back view of a pin electronics card in an embodiment of the present invention.
Figure 8A:
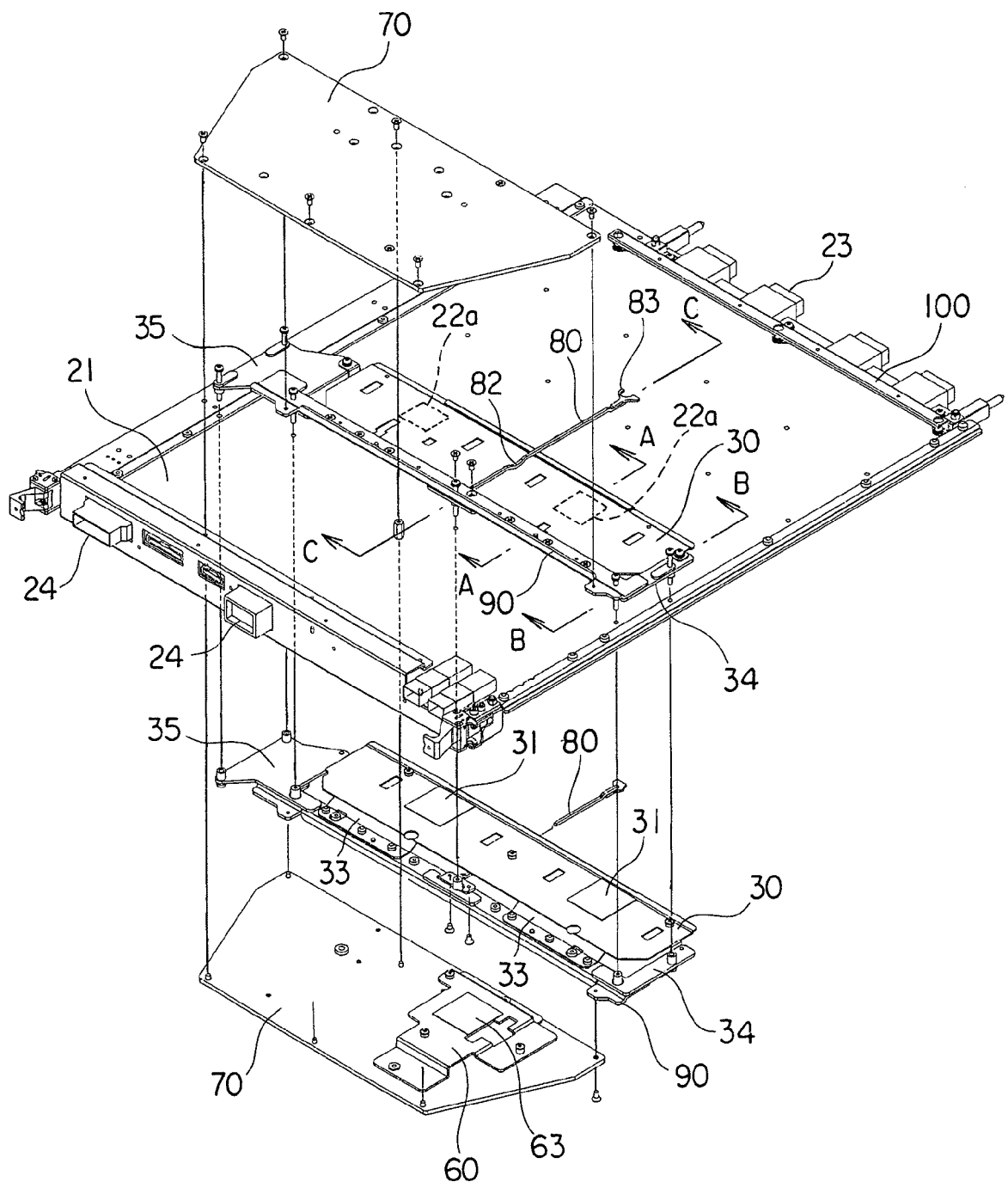
FIG. 8A is a disassembled perspective view of a pin electronics card in an embodiment of the present invention (part 1).
Figure 8B:
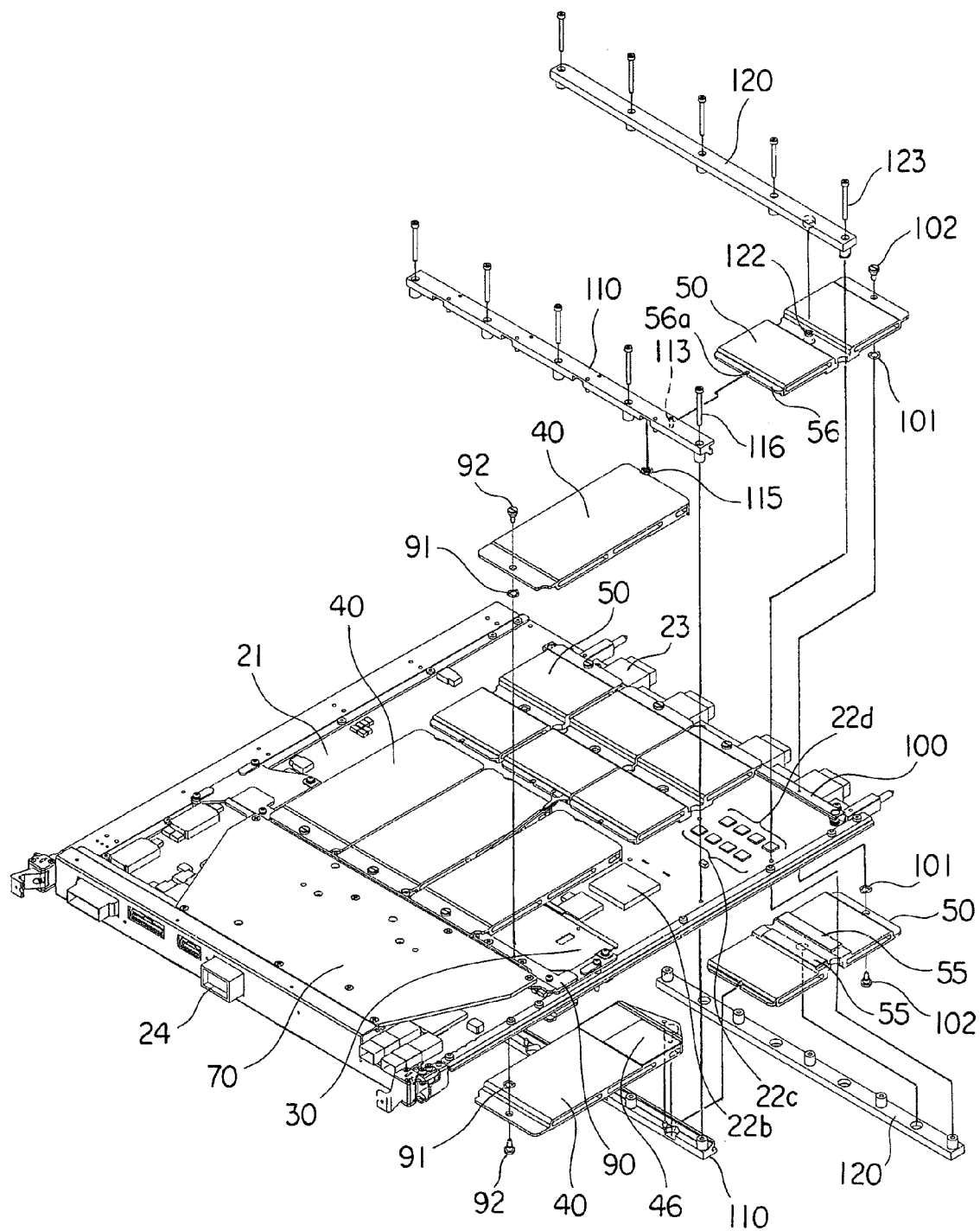
FIG. 8B is a disassembled perspective view of a pin electronics card in an embodiment of the present invention (part 2).
Figure 9A:
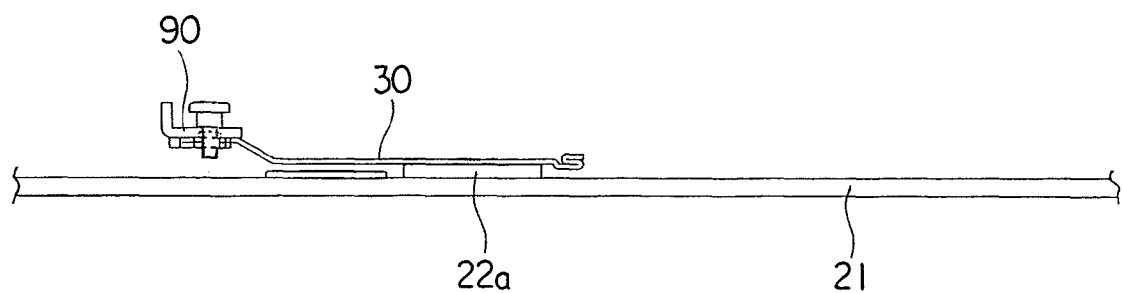
FIG. 9A is a cross-sectional view along the line A-A in FIG. 8A.
Figure 9B:
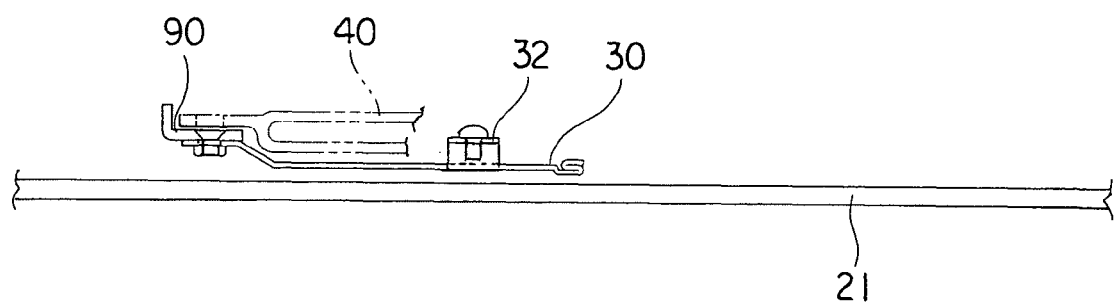
FIG. 9B is a cross-sectional view along the line B-B in FIG. 8A.
Figure 9C:
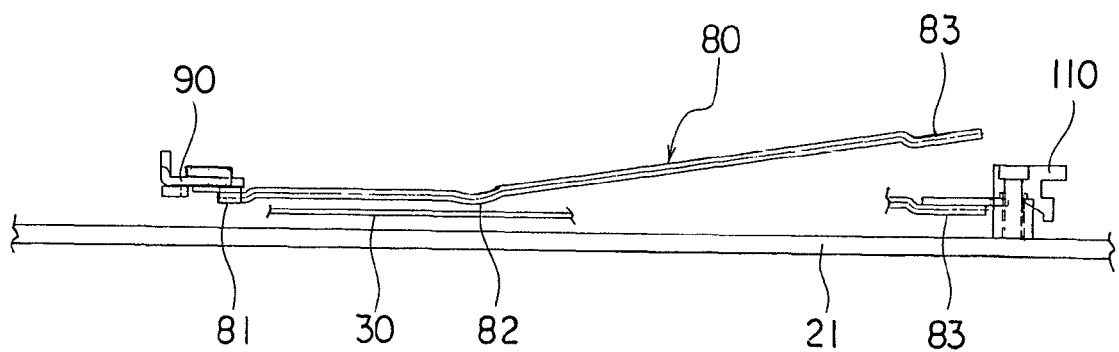
FIG. 9C is a cross-sectional view along the line C-C in FIG. 8A.
Figure 10:
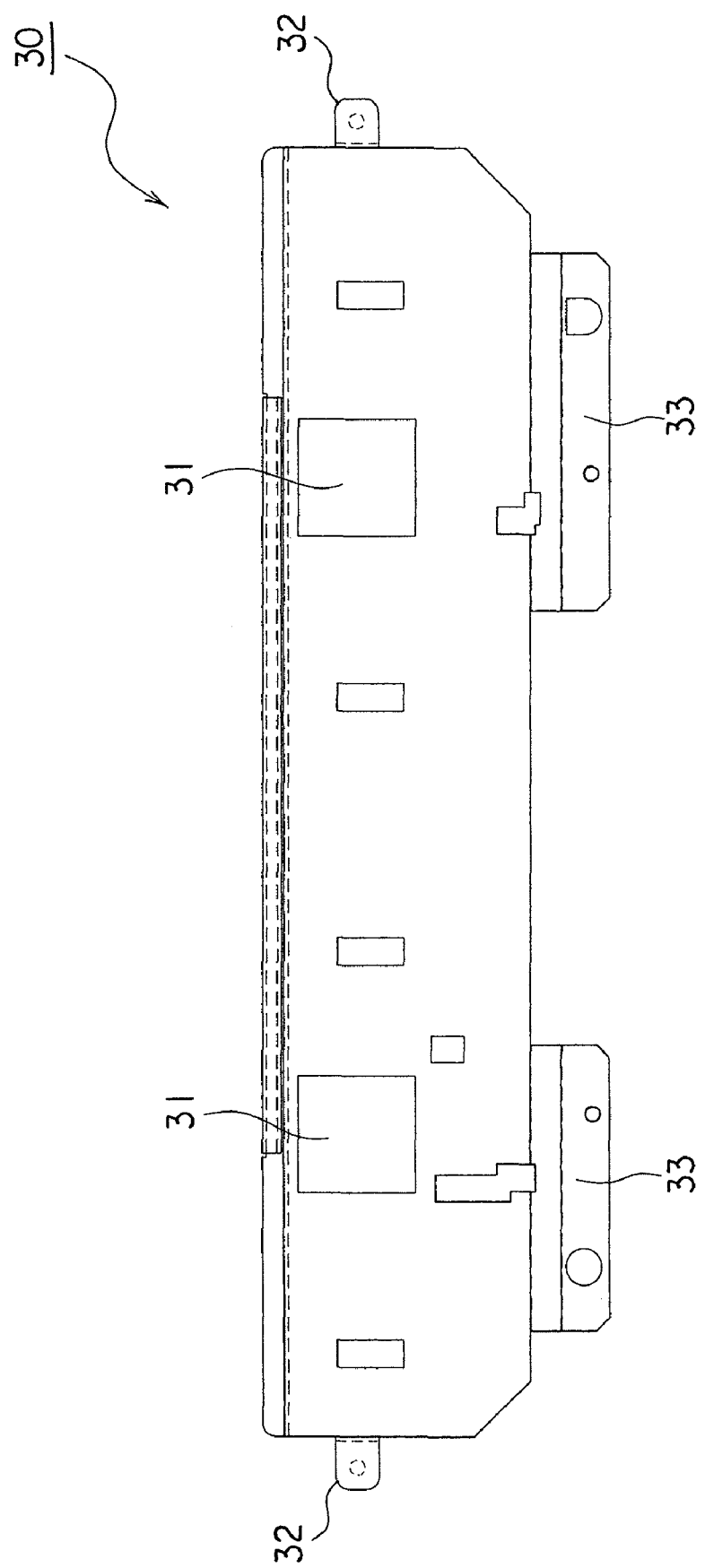
FIG. 10 is a plan view showing a first heat sink in an embodiment of the present invention.
Figure 11:
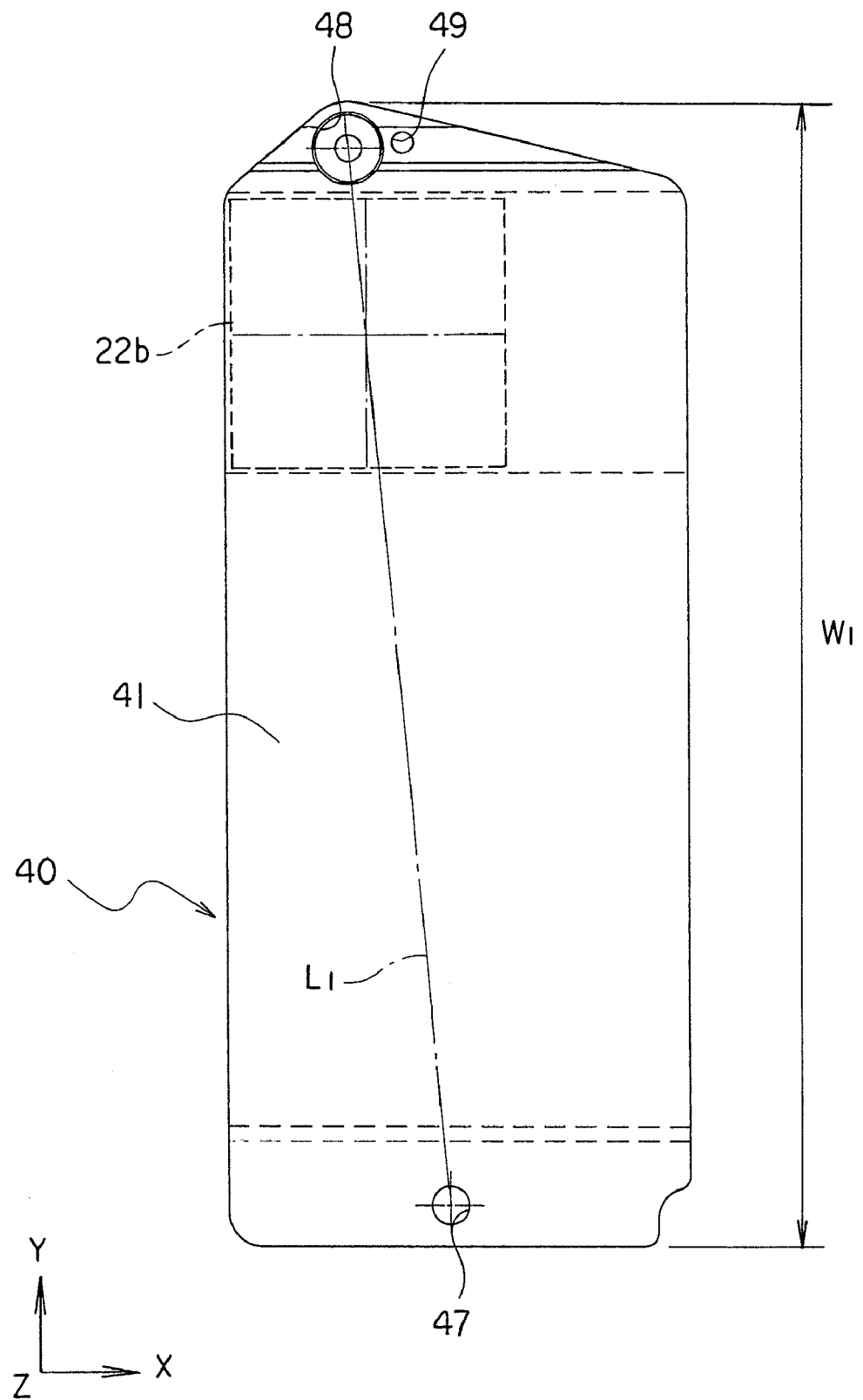
FIG. 11 is a plan view showing a second heat sink in an embodiment of the present invention.
Figure 12:
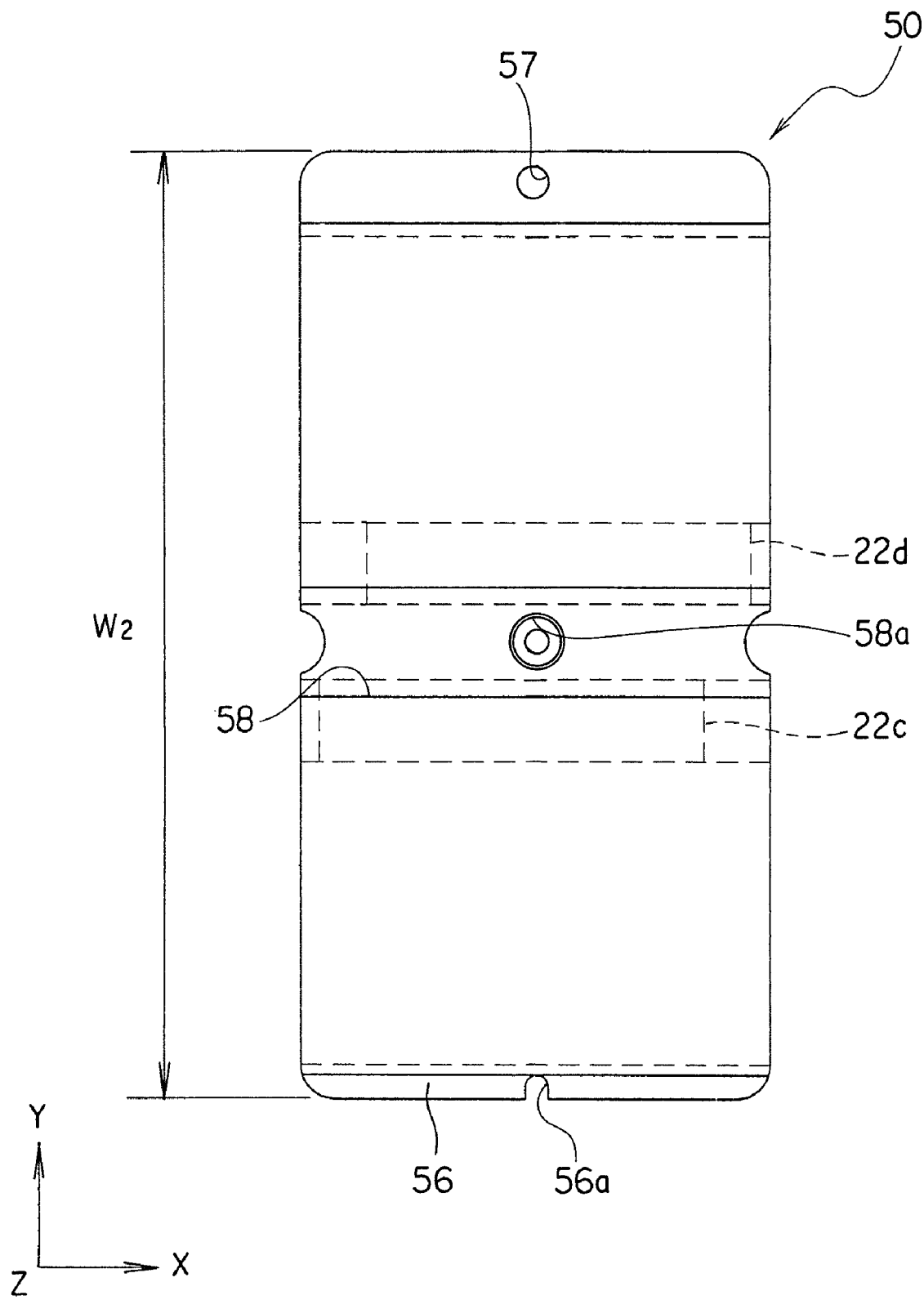
FIG. 12 is a plan view showing a third heat sink in an embodiment of the present invention.
Figure 13:
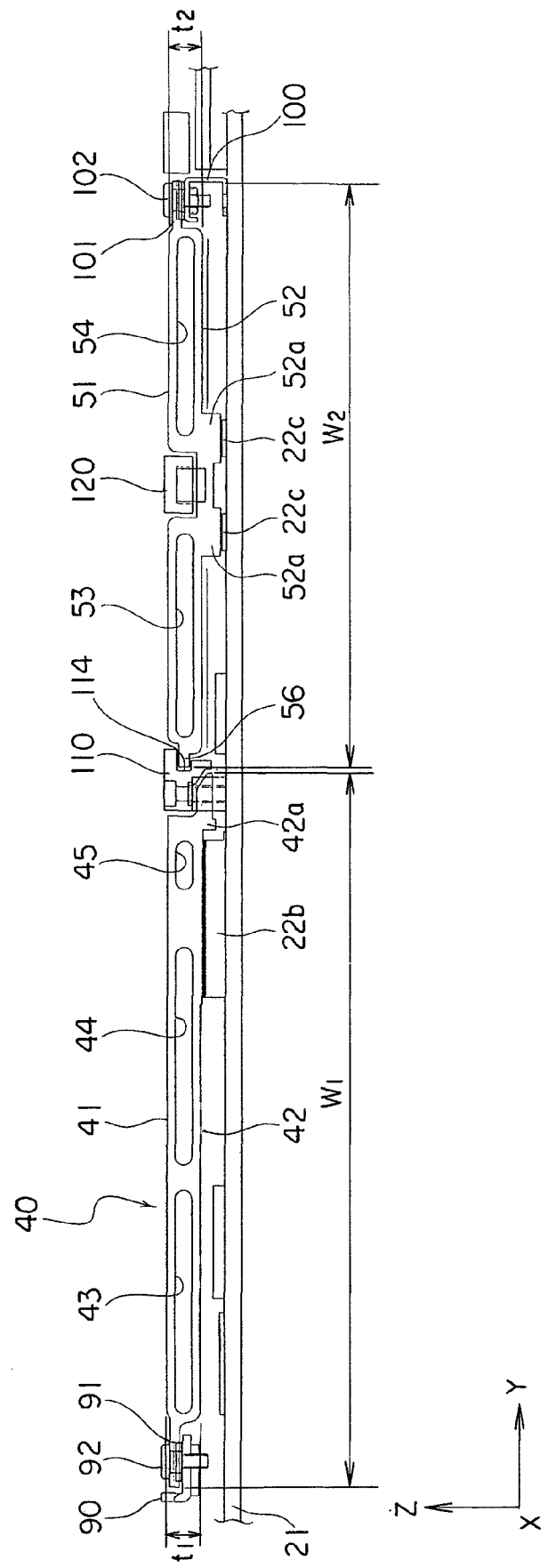
FIG. 13 is a cross-sectional view of second and third heat sinks in an embodiment of the present invention (cross-sectional view along the line A-A in FIG. 4).
Figure 14:
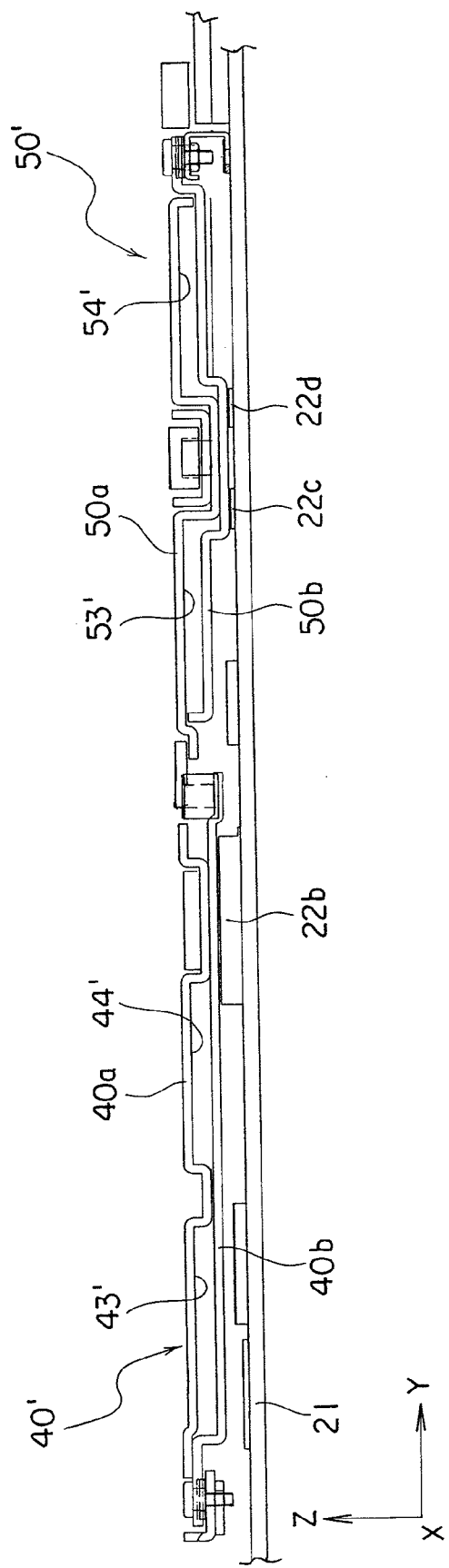
FIG. 14 is a cross-sectional view of second and third heat sinks in another embodiment of the present invention.
Figure 15:
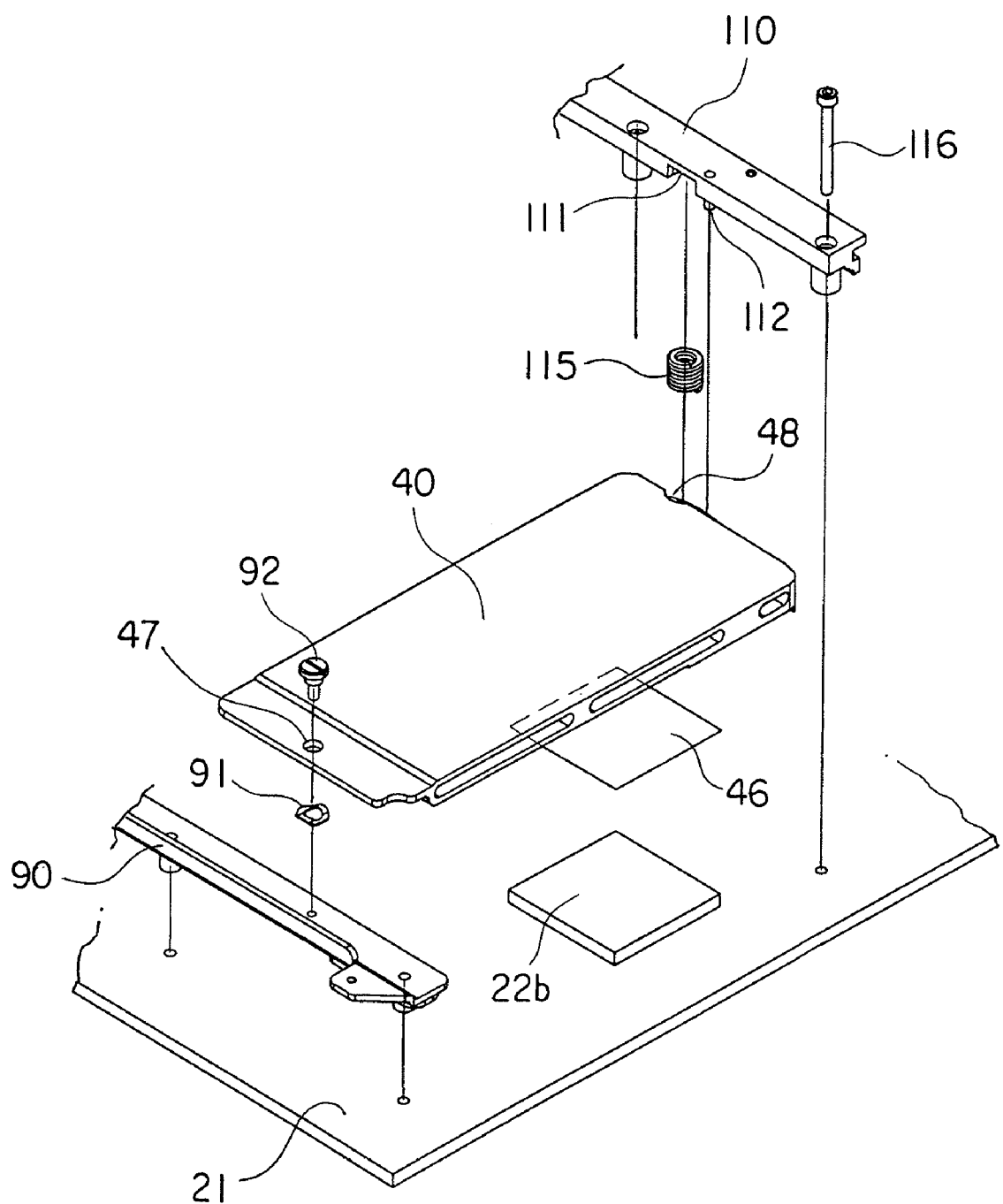
FIG. 15 is a disassembled perspective view of part of a pin electronics card in an embodiment of the present invention.
Figure 16:
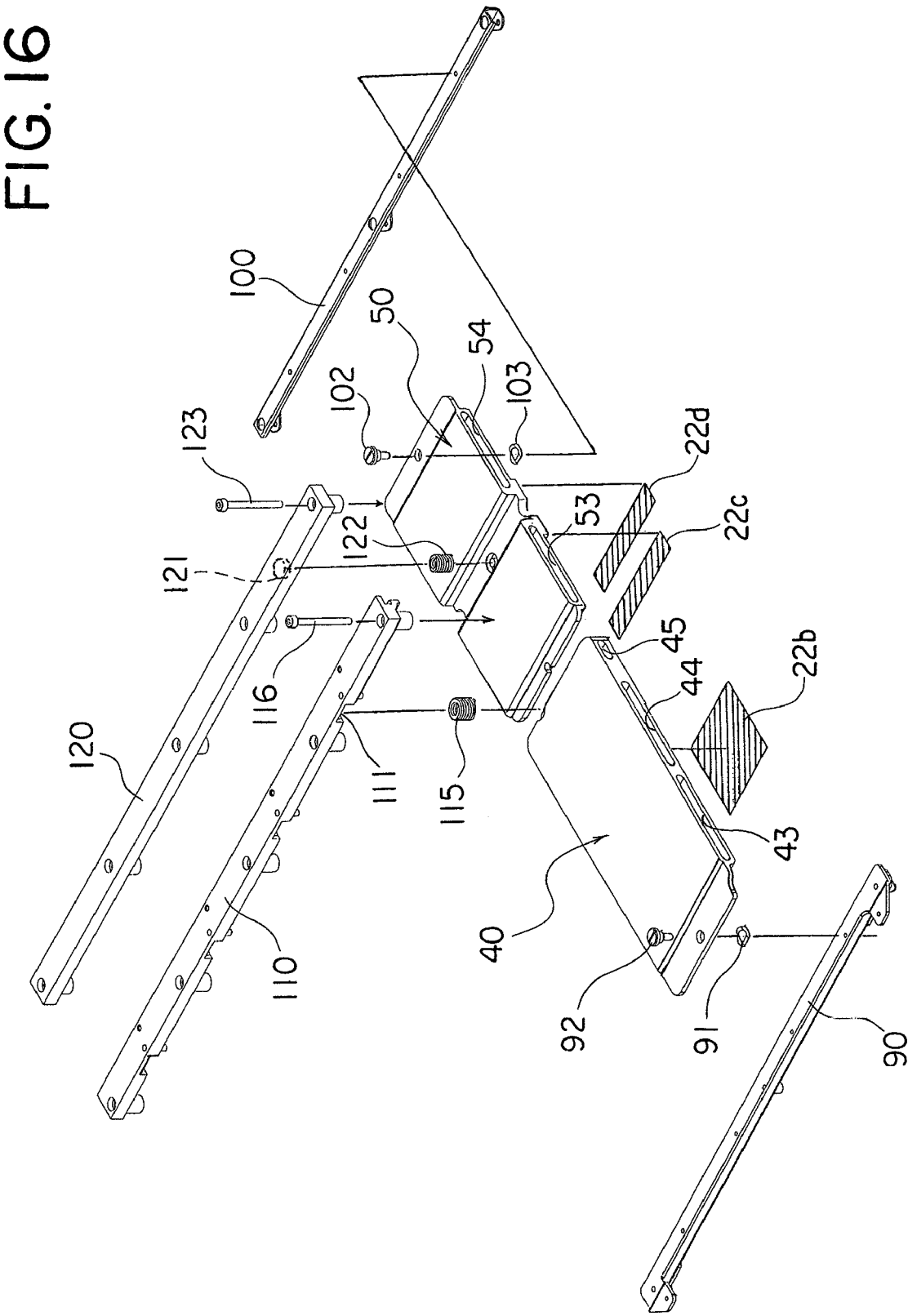
FIG. 16 is a disassembled perspective view of part of a pin electronics card in an embodiment of the present invention.
Figure 17:
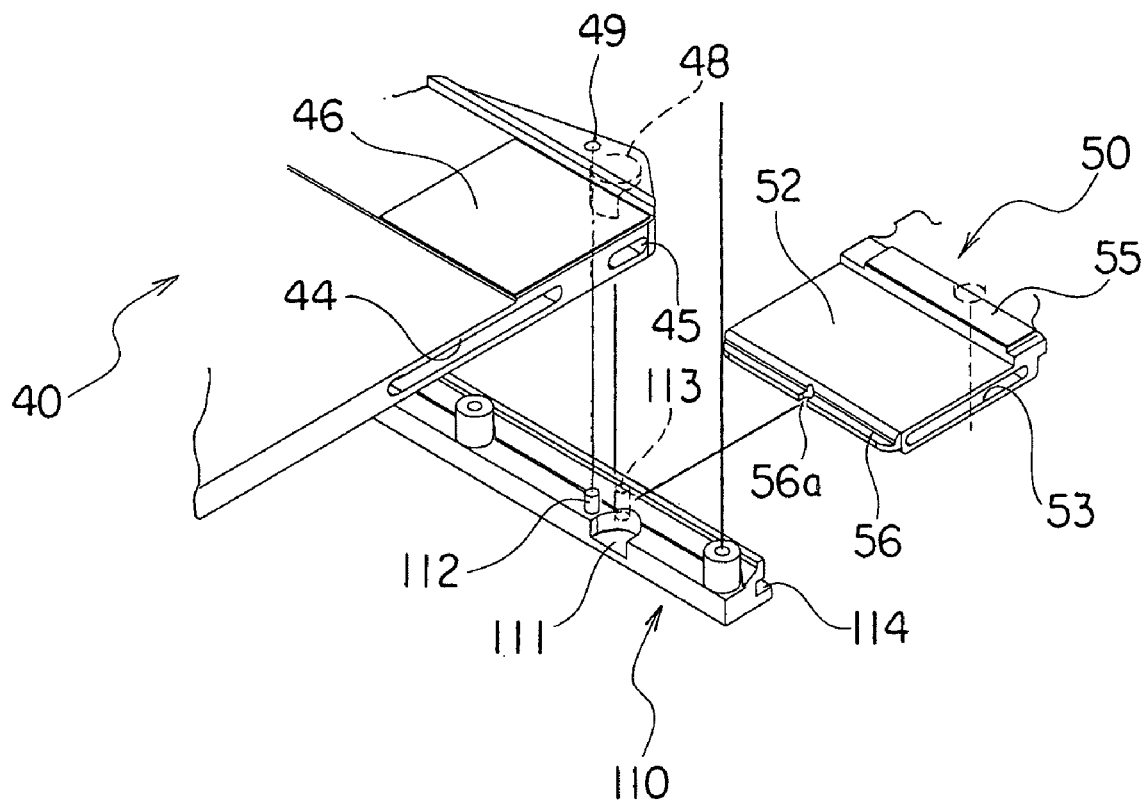
FIG. 17 is a disassembled perspective view showing the fitting relationship between the second and third heat sinks and the first pressing member in an embodiment of the present invention, that is, a disassembled perspective view seen from the side opposite to FIG. 16 (base surface side).
Figure 18:
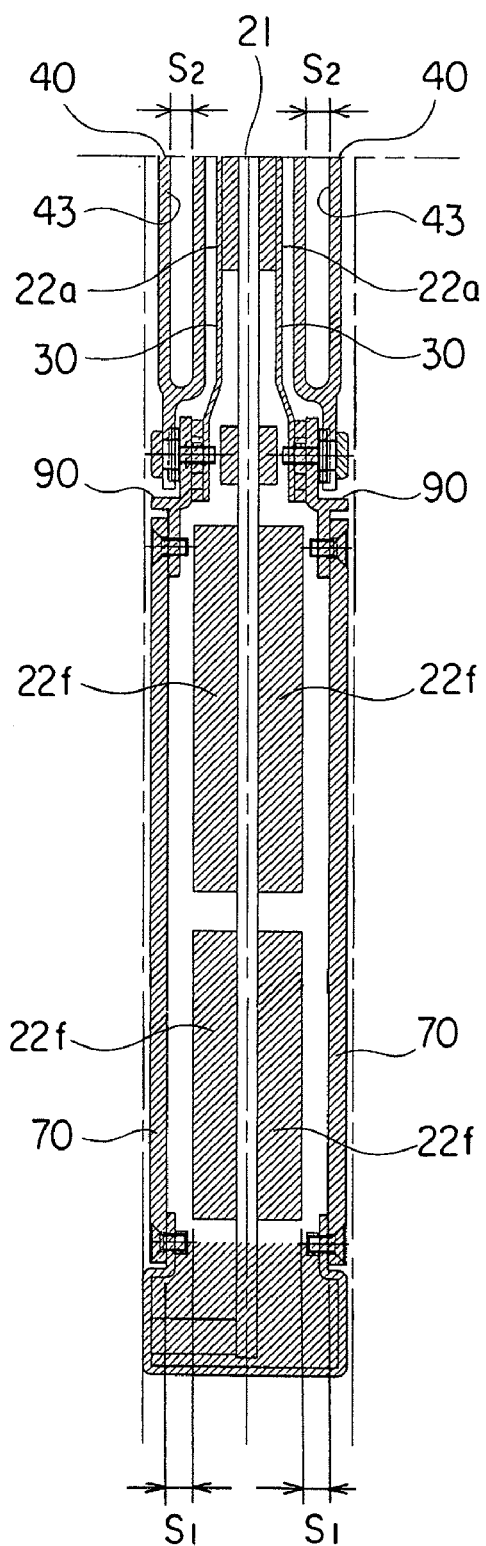
FIG. 18 is a cross-sectional view of an adjustment plate in an embodiment of the present invention (cross-sectional view along the line B-B in FIG. 4).
Figure 19:
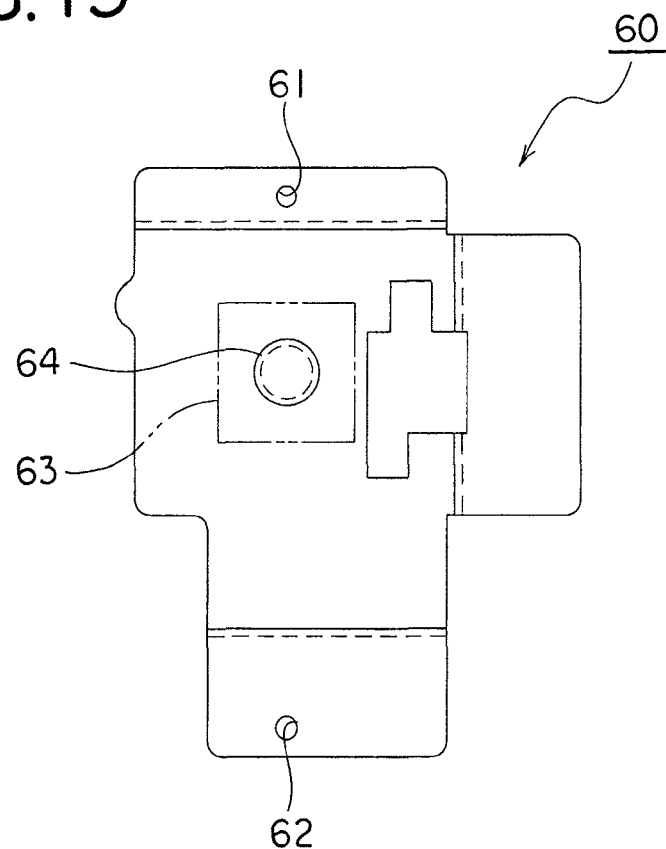
FIG. 19 is a plan view of a fourth heat sink in an embodiment of the present invention.
Figure 20:
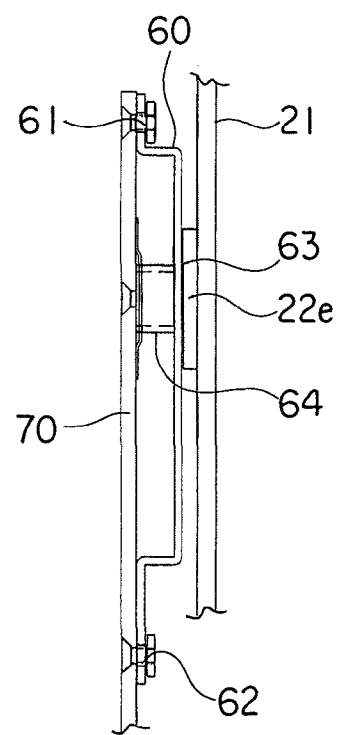
FIG. 20 is a cross-sectional view of an adjustment plate and a fourth heat sink in an embodiment of the present invention (a cross-sectional view along the line C-C in FIG. 4).

10 . . . test head
16 . . . fan
20 . . . pin electronics card
21 . . . board
22a to 22e . . . first to fifth devices under test
30 . . . first heat sink
40 . . . second heat sink
41 . . . top surface
42 . . . bottom surface
43 to 45 . . . through hole
47 . . . fastening hole (first point)
48 . . . recess (second point)
49 . . . guide hole
$L_1$ . . . first imaginary line
50 . . . third heat sink
51 . . . top surface
52 . . . bottom surface
53, 54 . . . first and second through holes
56 . . . engagement piece
56a . . . notch (first point)
57 . . . fastening hole (first point)
58 . . . groove
58a . . . recess (second point)
60 . . . fourth heat sink
70 . . . adjustment plate
80 . . . rod-shaped member
90 . . . first stay
100 . . . second stay
110 . . . first pressing member
112 . . . first guide pin
113 . . . second guide pin
115 . . . coil spring
120 . . . second pressing member
122 . . . coil spring

The invention claimed is:

1. A heat sink structure configured to cool electronic devices mounted on a board, comprising:
a first heat sink configured to cool a first electronic device mounted on the board;
a second plate-shaped heat sink configured to cool a second electronic device mounted on the board, the second heat sink having a top surface and a bottom surface;
a first stay to which the first heat sink and one end of the second heat sink are attached, and which is fastened to the board; and
a first pressing member which presses another end of the second heat sink to the board via a first elastic member, wherein
a first through hole penetrating along a planar direction of the board is formed between the top surface and the bottom surface of the second heat sink,
the second heat sink covers the first heat sink so as to form a space between the first heat sink and the second heat sink, and
the second electronic device is arranged between the first stay and the first pressing member in a plan view.

2. The heat sink structure as set forth in claim 1, further comprising:
a third plate-shaped heat sink configured to cool third and fourth electronic devices mounted on the board, the third heat sink having a top surface and a bottom surface;
a second pressing member which presses the middle of the third heat sink to the board via a second elastic member; and
a second stay which fastens one end of the third heat sink to the board, wherein
a second through hole penetrating along a planar direction of the board is formed between the top surface and the bottom surface of the third heat sink,
the first pressing member fastens another end of the third heat sink to the board,
the third electronic device is arranged between the first pressing member and the second pressing member in a plan view, and
the fourth electronic device is arranged between the second pressing member and the second stay in a plan view.

3. The heat sink structure as set forth in claim 1, wherein
the first pressing member has a guide pin projecting out toward the second heat sink, and
the second heat sink has a guide hole able to mate with the guide pin.

4. The heat sink structure as set forth in claim 2, wherein
the first pressing member has a guide pin projecting out toward the third heat sink, and
the third heat sink has a notch able to mate with the guide pin.

5. A heat sink structure for cooling an electronic device mounted on a board, the heat sink structure comprising:
a plate-shaped heat sink having a top surface and a bottom surface; and
a cover member covering an electronic device without the heat sink in the board, wherein
a through hole penetrating along a planar direction of the board is formed between the top surface and the bottom surface of the heat sink, and
a distance between the cover member and the electronic device is substantially the same as an inside diameter of the through hole along a thickness direction of the heat sink.

6. A test head comprising a plurality of boards, each of which has the heat sink structure as set forth in claim 5.

* * * * *